(12) United States Patent
Fantin et al.

(10) Patent No.: US 9,930,796 B2
(45) Date of Patent: Mar. 27, 2018

(54) VEHICLE DIAGNOSTIC INTERFACE MODULE

(71) Applicant: TEXA S.p.A., Monastier di Treviso (IT)

(72) Inventors: Mauro Fantin, Ponzano Veneto (IT); Igor Martinelli, Trebaseleghe (IT)

(73) Assignee: TEXA S.P.A., Monastier di Treviso (IT)

( * ) Notice: Subject to any disclaimer, the term of this patent is extended or adjusted under 35 U.S.C. 154(b) by 0 days.

(21) Appl. No.: 15/124,602

(22) PCT Filed: Mar. 13, 2015

(86) PCT No.: PCT/IB2015/051854
§ 371 (c)(1),
(2) Date: Sep. 8, 2016

(87) PCT Pub. No.: WO2015/136496
PCT Pub. Date: Sep. 17, 2015

(65) Prior Publication Data
US 2017/0020011 A1    Jan. 19, 2017

(30) Foreign Application Priority Data
Mar. 13, 2014  (IT) .......................... TV2014000011 U

(51) Int. Cl.
*H05K 1/14* (2006.01)
*H05K 5/02* (2006.01)
(Continued)

(52) U.S. Cl.
CPC ............ *H05K 5/0247* (2013.01); *G07C 5/02* (2013.01); *G07C 5/08* (2013.01); *H01R 12/57* (2013.01); *H01R 12/58* (2013.01); *H01R 13/665* (2013.01); *H01R 13/6658* (2013.01); *H05K 1/181* (2013.01); *H05K 5/0069* (2013.01); *H01R 2201/26* (2013.01); *H05K 1/117* (2013.01);
(Continued)

(58) Field of Classification Search
CPC .... H05K 5/0247; H05K 5/0069; H05K 1/181; H01R 2201/26; H01R 12/57; H01R 12/58; H01R 13/665; G07C 5/02
USPC ....................................................... 361/743
See application file for complete search history.

(56) References Cited

U.S. PATENT DOCUMENTS 3,964,087 A * 6/1976 Mallon .................. H01C 13/02
174/260
5,240,422 A * 8/1993 Kobayashi ............. H01R 13/41
439/78
(Continued)

FOREIGN PATENT DOCUMENTS

CN     202 454 060     9/2012
FR     2 068 863       9/1973
(Continued)

*Primary Examiner* — Hung S Bui
(74) *Attorney, Agent, or Firm* — Leason Ellis LLP

(57) ABSTRACT

Vehicle diagnostic interface module comprising: a printed circuit board, an OBD connector, which is provided with a plate-like contact-carrier socket arranged parallel to and facing the printed circuit board, a plurality of rigid pins, each of them having a first segment projecting from the inner face of the socket along an axis orthogonal to the printed circuit board and inserted in a notch formed on the outer perimeter edge of the board.

20 Claims, 4 Drawing Sheets

(51) Int. Cl.
  *H01R 12/57*  (2011.01)
  *H01R 12/58*  (2011.01)
  *H01R 13/66*  (2006.01)
  *G07C 5/02*  (2006.01)
  *G07C 5/08*  (2006.01)
  *H05K 1/18*  (2006.01)
  *H05K 5/00*  (2006.01)
  *H05K 1/11*  (2006.01)

(52) U.S. Cl.
  CPC .............. *H05K 2201/09181* (2013.01); *H05K 2201/1034* (2013.01); *H05K 2201/10545* (2013.01)

(56) References Cited

U.S. PATENT DOCUMENTS

| | | | | |
|---|---|---|---|---|
| 5,507,654 A | * | 4/1996 | Daly | H01R 12/57 439/76.1 |
| 5,967,802 A | * | 10/1999 | Daly | H01R 12/58 439/620.09 |
| 6,527,564 B1 | * | 3/2003 | Yeh | H01R 12/724 439/607.32 |
| 6,719,571 B2 | * | 4/2004 | Koerner | H05K 5/0069 439/76.1 |
| 6,870,096 B2 | * | 3/2005 | Suzuki | B60R 16/0239 174/50 |
| 7,128,582 B2 | * | 10/2006 | Fang | H01R 13/514 439/362 |
| 7,225,065 B1 | | 5/2007 | Hunt et al. | |
| 2013/0218371 A1 | * | 8/2013 | Simard | B60W 50/08 701/2 |
| 2013/0328543 A1 | | 12/2013 | Chen et al. | |

FOREIGN PATENT DOCUMENTS

GB  2 287 586  9/1995
JP  2000 294321  10/2000

* cited by examiner

VEHICLE DIAGNOSTIC INTERFACE MODULE

CROSS REFERENCE TO RELATED APPLICATIONS

The present application is a U.S. National Phase of International Patent Application PCT/IB2015/051854 filed on Mar. 13, 2015, which claims priority to Italian Application No. TV2014U000011, filed on Mar. 13, 2014, each of which is incorporated by reference as if expressly set forth in their respective entireties herein.

TECHNICAL FIELD

The present invention concerns a vehicle diagnostic interface module, preferably an interface module for OBD vehicles.

In particular, the present invention concerns a diagnostic interface device or module of the type preferably comprising an OBD connector (acronym for On-Board Diagnostics) which is adapted to be coupled, in use, to an OBD diagnostic socket/port present on board of a motor vehicle, for example a car, a motorcycle, a boat, or the like; to which the following description will make explicit reference without thereby losing generality.

BACKGROUND ART

It is known that some motor vehicles are provided with an on-board diagnostic port, generally arranged under the operation panel and the steering wheel, coupled to the connector of an outer vehicle diagnostic electronic instrument which can access, through the diagnostic to various vehicle information/data, such as e.g. error codes stored by the vehicle electronic control system. In this case, the electronic control system receives, stores and processes the vehicle information/data on the basis of the signals generated by the various electronic/electrical control equipment/sensors in the vehicle.

The on-board diagnostic port is made according to the communication standard of OBD vehicle data (i.e. OBD II in the USA, or E-OBD in Europe), standard which, as already known, sets the shape/size of the trapezoidal connector frame, the number and the arrangement of the pins in the connector, and the communication protocols to be used to communicate with the on-board electronic control system through the OBD port pins.

It is also known that the acquisition of: vehicle information/data during the movement of the vehicle, is carried out through recently created portable diagnostic interface modules which are "miniaturized" devices, i.e. having a reduced overall size if compared to the aforesaid traditional vehicle diagnostic electronic means. In this case, the diagnostic interface modules are designed to be coupled to the OBD port so as to remain in the vehicle during its movement, and are configured to acquire/store information/data contained in the on-board electronic control unit and, in case, to send them to a vehicle diagnostic electronic system outside of the vehicle through wireless communication.

FIG. 1 shows an example of a known OBD I diagnostic interface module comprising: an outer casing II, an electronic module III which is arranged inside the casing II to perform the diagnostic functions of acquisition and/or storage and/or communication of the aforesaid vehicle data, and an OBD IV connector adapted to be coupled to a vehicle OBD port (not shown). The OBD IV connector is provided with a plate-like socket V transverse to a longitudinal reference axis W and to sixteen pins VI, which are arranged on the socket V so as to form two parallel rows, each comprising eight parallel pins VI, equidistantly lying on a common plan. The pins VI have a rectilinear pin shape, parallel to the axis W and are coupled to the socket V so as to have a first end projecting from an outer face of the socket V to extend within a trapezoidal collar VII of the OBD connector, and a second end VIII projecting from the opposite inner face IX of the socket V and being electrically coupled to the electronic module III. The electronic module III comprises, in turn, two printed circuit boards X projecting from the inner face VIII of the socket V, which are arranged on two respective parallel lying planes corresponding to the lying planes of the two rows of pins VI. The side of the perimeter edge of each printed circuit board X rests on the inner face IX of the socket V and, on a larger surface, has some superficial plots, electrically soldered to the second projecting portion VIII of the pins VI which happens to be close to the larger surface.

The aforesaid OBD vehicle diagnostic interface module has the technical problem of being particularly cumbersome due to the "longitudinal" arrangement of the printed circuit boards inside the casing. In particular, the arrangement of the printed circuit boards along planes parallel to the longitudinal axis results in an increase of the overall volume of the module inside the car. Therefore, the module is subject to damage due to an accidental collision caused by the driver, and/or to vibration/stress generated by the displacement of the vehicle.

Furthermore, in the aforesaid modules, the mutual arrangement boards-pins makes particularly complex their electrical coupling during the module manufacturing process, with all the consequences that this implies in terms of costs and production capacity. In fact, the board-pins arrangement coplanar to planes parallel to the axis A necessarily requires manual, precise operations by soldering pins to the plots predisposed in boards, said operations being complex and therefore incompatible with the operation times required to sufficiently reduce the module cost.

The document CN 202 454 060 U describes an OBD vehicle diagnostic interface module provided with an outer casing, two printed circuit boards arranged inside the housing, their positions being parallel and facing each other and orthogonal to the module longitudinal reference axis, and a connector adapted to be coupled to a vehicle diagnostic port. The connector is provided with a plate-shaped socket, transverse to the longitudinal reference axis, and with a series of pins projecting from one of the two boards to be inserted in as many through holes formed in the socket. The document CN 202 454 060 U has the technical problem of requiring a specific printed circuit board for supporting and connecting the pins. Obviously, the pins occupy part of the useful space of the board, thereby requiring the use of an additional board for supporting and connecting the electronic components of the module, resulting in an increased volume and manufacturing costs.

The document U.S. Pat. No. 7,225,065 describes a vehicle wire connection system comprising a series of adapter modules for an OBD diagnostic connector.

DISCLOSURE OF INVENTION

The Applicant has therefore conducted a thorough study whose purpose was to find a solution that would specifically achieve the objective of creating an OBD interface module having a reduced overall size and, simultaneously, a simplified structure to allow the electrical coupling of the contacts of the OBD connector to the printed circuit board through automatic industrial coupling processes, in order to reduce its manufacturing costs.

Object of the present invention is therefore to provide a solution that achieves the aforesaid objectives.

This object is achieved by the present invention in that it concerns a preferably OBD vehicle diagnostic interface module, as defined in the appended claims.

This object is achieved by the present invention in that it concerns a method for manufacturing a vehicle diagnostic interface module as defined in the appended claims.

BRIEF DESCRIPTION OF THE DRAWINGS

The present invention will now be described with reference the accompanying drawings, which illustrate a non-limitative embodiment, wherein:

FIG. 7 is a partial exploded view of the connector of the module of FIG. 2; while

BEST MODE FOR CARRYING OUT THE INVENTION

Figure 1:
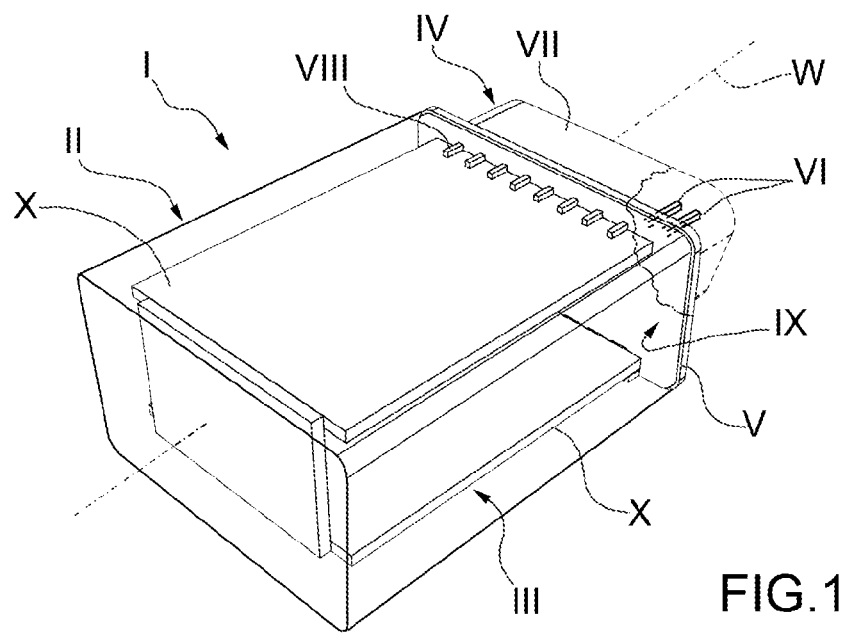
FIG. 1 is a perspective view of an OBD diagnostic interface module of known type.

The present invention will now be described in detail with reference to the accompanying drawings to enable a person skilled in the art to make and use it. Various modifications L the aforesaid embodiments will be immediately apparent to the person skilled in the art, and the described generic principles can be applied to other embodiments and applications without departing from the scope of the present invention as defined in the appended claims. Therefore, the present invention should not be regarded as limited to the described and illustrated embodiments, but it should be granted the widest protective scope consistent with the principles and features herein described and claimed.

With reference to FIGS. 2-6, the reference number indicates as a whole vehicle diagnostic interface module, preferably OBD, which is designed to be coupled in a stable but easily removable way to a preferably OBD diagnostic socket or port (not shown) of a motor vehicle (not shown), such as a car, a motorcycle, a boat or the like, and is configured to communicate with an on-board electronic system of said vehicle through the diagnostic port to perform a plurality of vehicle diagnostic functions.

The diagnostic module 1 preferably comprises an OBD connector 2 provided with a plurality of pins 3, preferably male pins, adapted to be coupled, in use, preferably with respective female contacts present in an OBD diagnostic port (not shown), an electronic module 4 electrically coupled to pins 3 as described hereinafter, and an outer casing 5, which, in the illustrated example, comprises substantially parallelepiped-shaped cover which is coupled to the OBD connector to contain/lock inside it the electronic module 4.

According to a preferred embodiment shown in FIGS. 2-9, the OBD connector 2 comprises a pin-carrier socket substantially plate-shaped, preferably rectangular or the like. The socket 6 is arranged on a plane which is orthogonal to a longitudinal reference axis A and comprises: an inner ace facing the electronic module 4, a substantially trapezoidal collar 9 surrounding the pins 3 and projecting from an opposite outer face 8, two larger sides 13 and two smaller sides 14.

Figure 4:
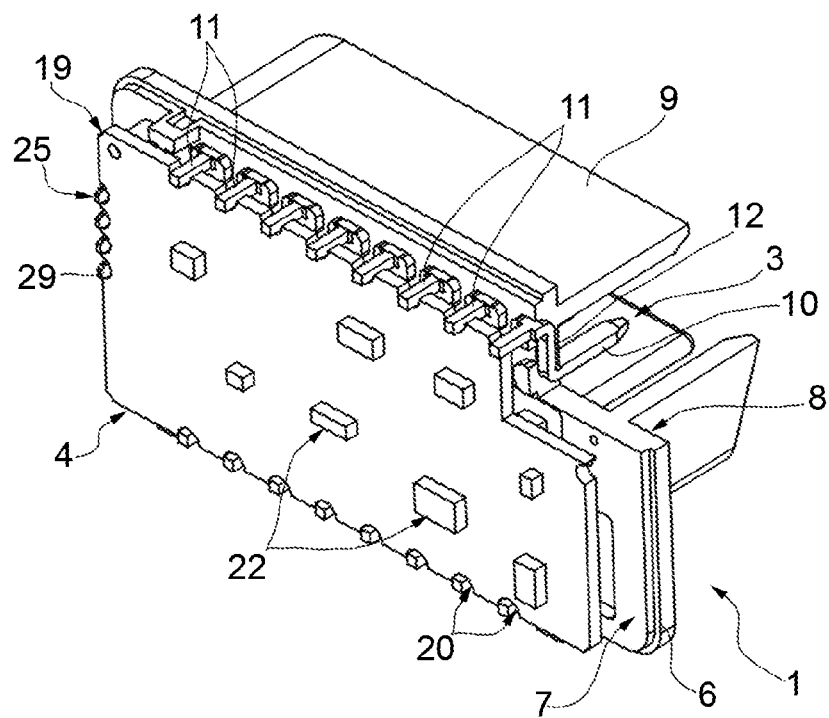
FIG. 4 is a perspective view, with parts removed for clarity's sake, of the diagnostic interface module of FIGS. 2 and 3.
Figure 5:
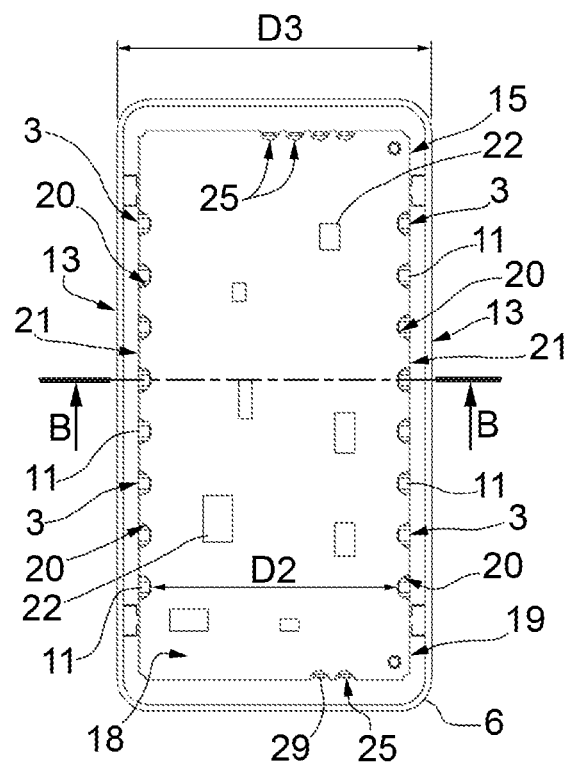
FIG. 5 is a rear view, with parts removed for clarity's sake, of the diagnostic interface module of FIGS. 2 and 3.
Figure 6:
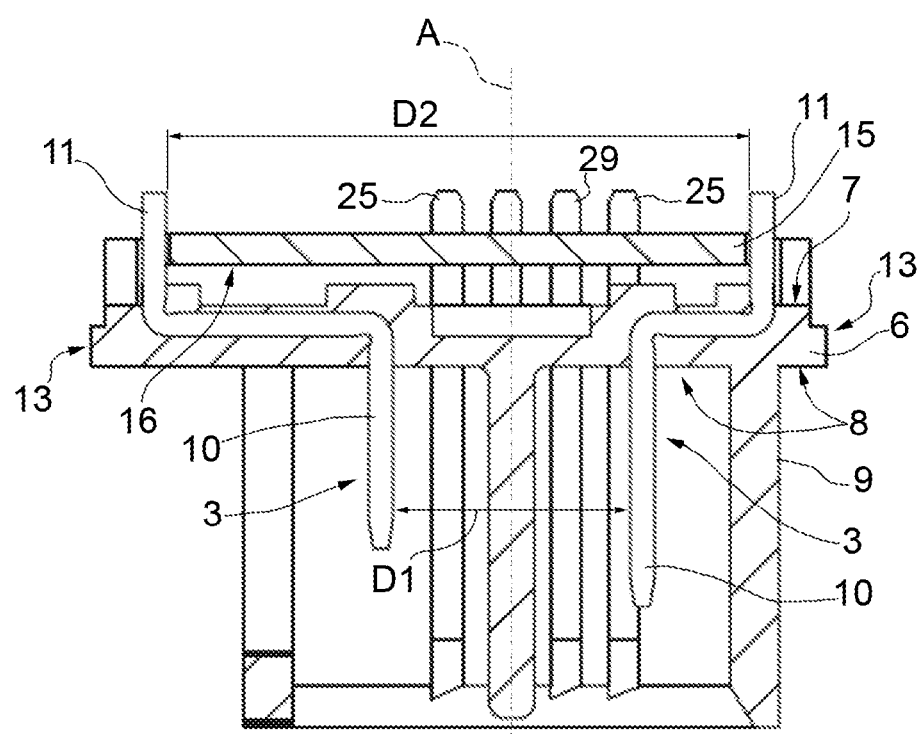
FIG. 6 is a section of the OBD diagnostic interface module of FIG. 5 along the line BB.
Figure 7:
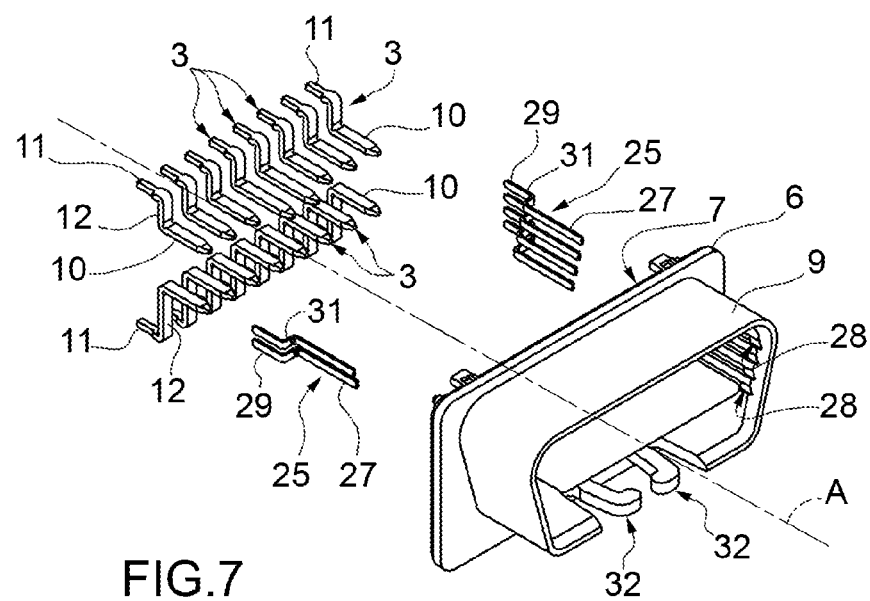

According to a preferred exemplificative embodiment shown in FIGS. 4, 6 and 7, the pins 3 are stably coupled to the socket 6 and are substantially Z-shaped. Each pin 3 comprises: at one end, a first segment 11, projecting from the face 7 to protrude/extend within the casing 5 while remaining preferably parallel to the axis A; a second segment 10, projecting from the face 8 to protrude/extend within the collar 9 while remaining parallel to the axis at the opposite end, a central intermediate segment 12 which is stably coupled/integrated to/in the socket 6 and extends substantially within the same along a direction transverse to the axis A.

According to a preferred exemplificative embodiment shown in FIGS. 3, 4, 8 and 9, the second segments 10 of the pins 3 can be shaped as "male pins", preferably pin-shaped, and are centrally arranged on the face of the socket 6 to form two rows facing each other. Each row lies in a plane parallel to and facing the lying plane of the other row and the axis A at a predetermined distance D1, and preferably comprises the second segments 10 of eight equidistant pins, parallel to each other, one after the other. The second segments 10 of the eight pins are arranged on the socket 6 according to the OBD standard.

Figure 2:
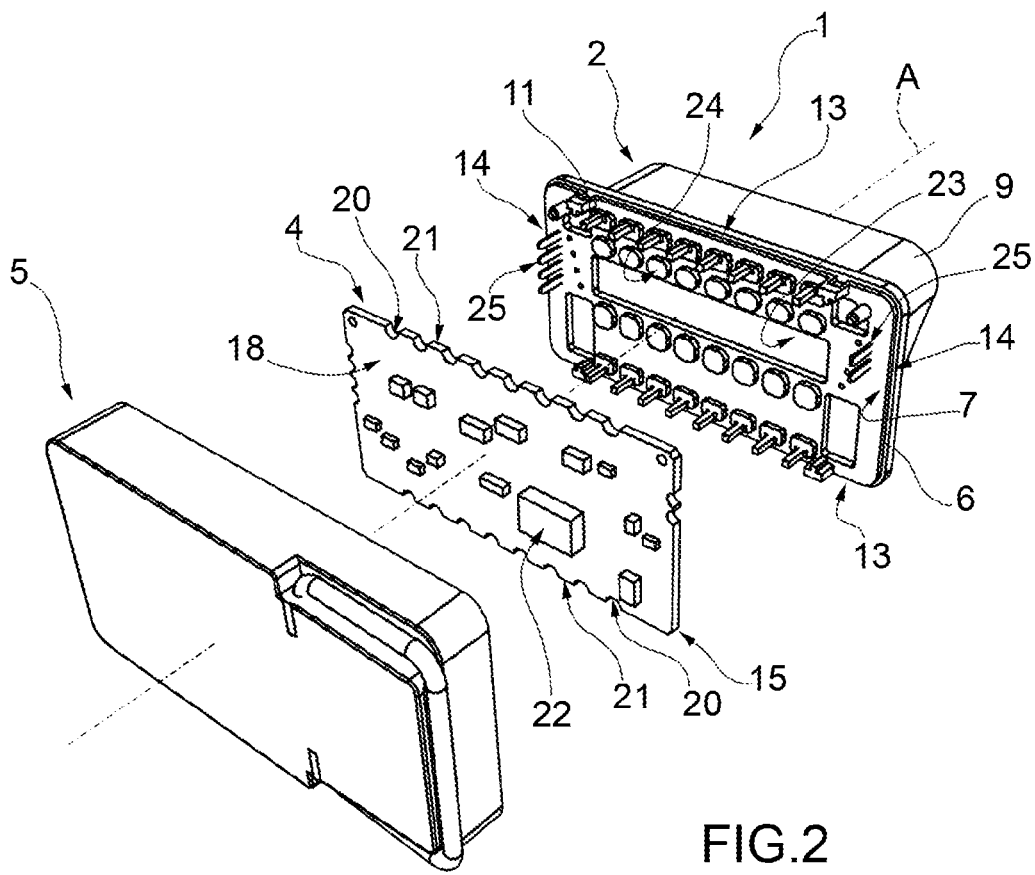
FIG. 2 is an exploded view of an OBD diagnostic interface module according to the teaching of the present invention.

According to a preferred exemplificative embodiment shown in FIGS. 2 and 4, the first segments 11 of the pins 3 can preferably be substantially pin-shaped and are arranged on the socket 6 to form two rows projecting from the face 7 and arranged in correspondence to the two opposite larger sides 13 of the socket 6. Each row of the first segments 11 lies on a plane parallel to but not coincident with the lying planes of the rows of second segments 10, and is preferably formed by the first segments 11 of eight pins, equidistantly arranged, one after the other. Preferably, the two rows formed by the first segments 11 are parallel to the two larger sides 13, while the distance D2 between the lying planes of the rows is conveniently larger than the distance D1. According to a possible embodiment shown in FIG. 5, the distance D2 between the two rows formed by the first segments 11 approximates by defect to the distance D3 between the larger sides 13 of the socket 6.

According to a preferred exemplificative embodiment shown in FIGS. 2 to 6, the electronic module 4 comprises at least one printed circuit board (PCB) 15, having a preferably but not necessarily rectangular shape, which is orthogonal to the axis A in a plane parallel to the lying plane of the socket 6, and has a face 16 adjacent to the face 7 of the socket 6, a face 18 opposite to the face 7, and an outer perimeter edge 19 on which seats/indentations or notches 20 are formed, housing respective first segments 11 of the pins 3. It is clear that the seat/indentation or notch formed on the outer perimeter edge 19 defines a cavity or semi-circular hole which is open to the outside.

According to a preferred exemplificative embodiment shown in FIGS. 2 to 6, the notches 20 are formed on the sides, i.e. on the two opposite larger sides 21 of the printed circuit board 15, arranged one after the other at such a distance that they can house inside them the first segments 11 of the two rows projecting from the face 7 of the socket 6. The Applicant has found that giving a Z-shape to the rigid pins 3 so that the first segment 11 is arranged inside the notches 20 formed on the two opposite larger sides 21 of the printed circuit board 15 allows to arrange the board 15 in a plane parallel to the socket 6 close to it, and therefore to conveniently obtain a reduction in the axial size of the module 1. In this case, the arrangement of the board 15 close to the socket allows getting a casing or cover 15 having a thickness (height/depth) measured along the axis A less than about 1 cm. The Applicant has also found that the arrangement of the first rigid segments 11 on the opposite larger sides 13 of the socket 6 and, simultaneously, the presence of the notches 20 on the opposite larger sides 21 of the board 15, allow the self-centring of the board on the socket 6 during the assembly operations, resulting in a significant reduction in the execution time/costs. Furthermore, it is possible to conveniently structure/size the first segments 11 so that their electrical coupling to respective plots present in the printed circuit board 15 in correspondence to the notches 20 is performed by automated soldering processes, the so-called reflow processes or the like.

According to a preferred exemplificative embodiment shown in FIG. 2, the printed circuit board 15 includes electronic components 22 that are electrically associated to a printed circuit of the board 15 and project from the face 16 so as to be partially housed inside a seat 23 formed on the face 7 of the socket 6. In order to guarantee the cooling of the electronic components 22, the face 7 of the socket 6 can centrally have projecting spacer elements 24 on which the printed circuit board 15 rests. The projecting spacer elements 24 are sized so as to keep the printed circuit board 15 at a predetermined distance from the face 7, for example 3 mm, to allow its ventilation.

According to a possible embodiment, the printed circuit board 15 may be structured so as to have electronic components 22 also on the opposite face 18. The Applicant has found that, by arranging the printed circuit board 15 on a plane parallel to the socket 6, by arranging the first segments 11 on its larger sides and by forming the seat 23 on the socket 6, it is possible to use/exploit the entire area/surface of both opposite faces 16, 17 of the printed circuit board 15 for mounting/supporting the electronic components 22, thereby obtaining a further reduction of the overall size and costs.

According to a possible embodiment shown in FIG. 7, the module 1 can further comprise, preferably necessarily, one or more but not additional side pins 25, which are stably coupled to the socket 6 and are substantially Z-shaped. Each side pin 25 is rigid and comprises: at one end, a first segment 29 which projects from the face 7 so as to protrude/extend within the casing 5 while remaining preferably parallel to the axis A to be housed in a longitudinal notch/groove 30 formed on a shorter side of the board 15; a second segment 27 which projects from the face 8 so as to protrude/extend in a respective notch 28 formed on a side wall of the collar 9, while remaining parallel to the axis A; and a central intermediate segment 31 which is stably coupled/integrated to/in the socket 6 and extends within the same along a direction transverse to the axis A.

Preferably, the notches 28 are formed on the inner side surfaces of the collar 9, and extend parallel to each other and to the axis A for substantially the height of the collar 9 measured along the axis A. Preferably, the second segments 27 of the side pins 25 are shaped so that, in use, they are electrically coupled to corresponding additional electrical side contacts present on one or more side surfaces of an OBD female electrical connector (not shown) coupled to the collar.

Figure 3:
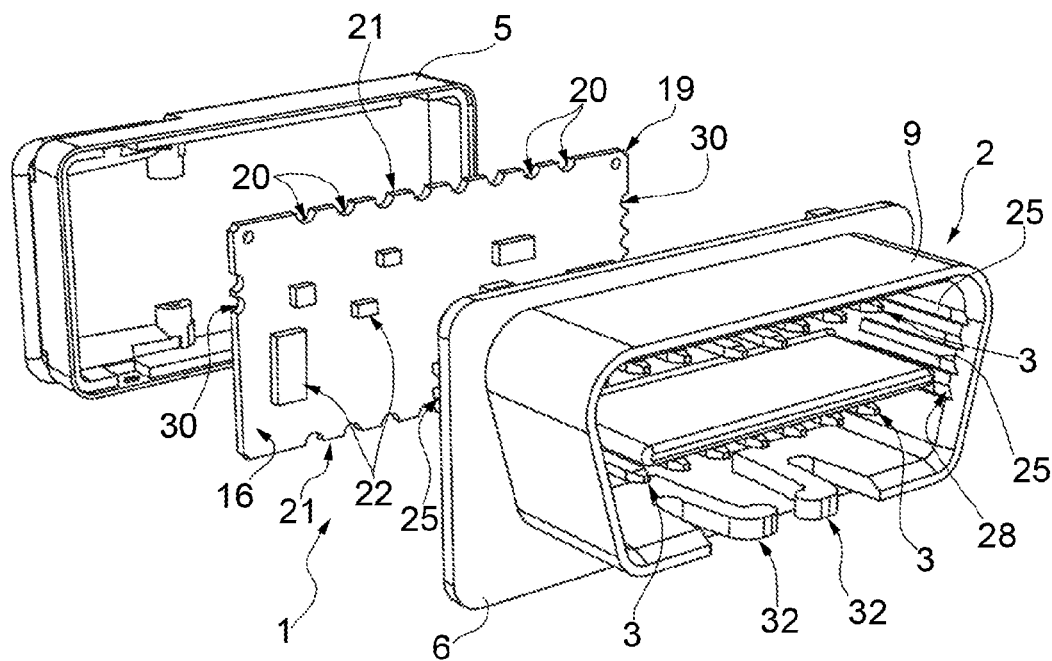
FIG. 3 is an exploded partial view of the diagnostic interface module of FIG. 2 according to a different perspective.
Figure 8:
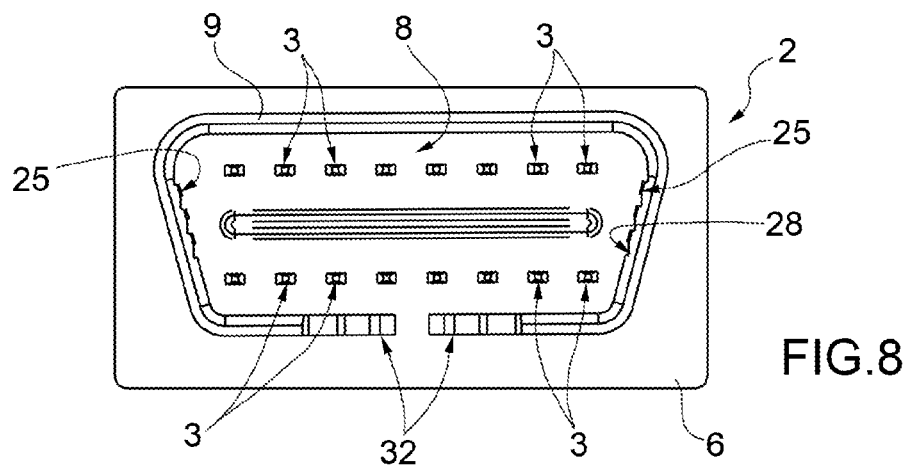
FIGS. 8 and 9 show, respectively, a front elevational view and a perspective view of the connector of the module of FIG. 2.
Figure 9:
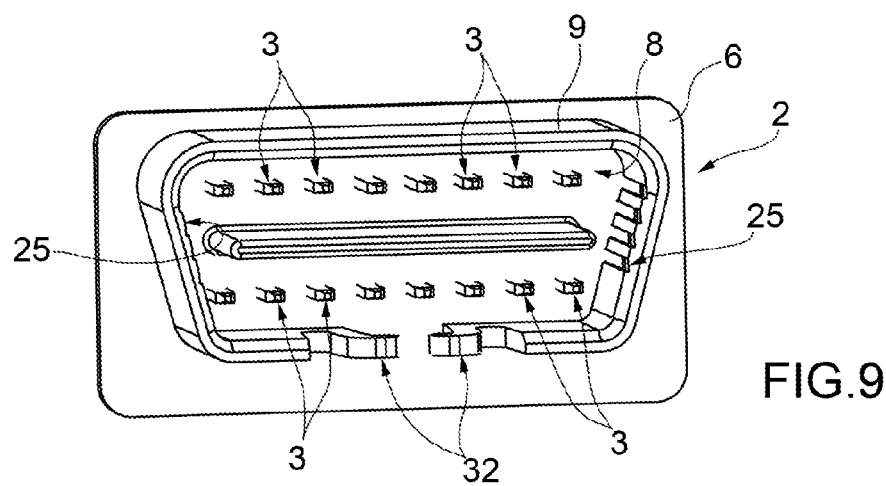

According to a possible embodiment shown in FIGS. 3, 8 and 9, the OBD electrical connector 2 can comprise, for example, two side pins 25 having the second segments 27 arranged in two respective longitudinal notches 28 formed on a first oblique side of the collar 9, and four side pins 25 having the second segments 27 arranged in four longitudinal notches 28 formed on a second oblique side of the collar 9 opposite the first side.

Preferably, the first segments 29 may be structured/sized so that their electrical coupling with respective plots present in the printed circuit board 15 in correspondence to the notches 30 is carried out by automated soldering processes, the so-called reflow soldering.

According to a possible embodiment shown in FIGS. 2-6, the side pins 25 are substantially Z-shaped and are adapted in use to communicate information/data through a communication protocol not included in the OBD standard. The communication protocol associated with the side pins 25 may e.g. be selected among a USB, Ethernet, LAN protocol or the like. The Applicant has found that the use of the side pins 25 is convenient as it allows to exchange data through additional protocols, namely not included in the OBD standard, but without altering the geometry of the OBD connector and/or the number/arrangement of the OBD pins 3.

According to a possible embodiment shown in FIGS. 2-6, the smaller base of the collar 9 can be conveniently shaped to form two flexible tongues 32, coplanar and parallel to each other and to the smaller base, which are arranged on opposite sides of the central plane of the collar 9 and form, in use, a snap-lock fastening system with an engagement tooth (not shown) arranged on the OBD socket and/or a female electrical connector (not shown). The two flexible tongues 32 are substantially hook-shaped and can partially diverge when they are inserted in the engagement tooth so as to side on its side walls and then, at the end of the side walls, to be clamped onto the tooth to complete the snap-lock fastening of the connector with the OBD socket and/or with the ale electrical connector. The Applicant has found that the use of two flexible hook-shaped tongues, which first snap open and then snap shut on the two opposite sides of the tooth, allows to couple the male connector 2 to the socket and/or to any female connector, regardless of the size of the tooth, and greatly reduces the wear and therefore the likelihood of breakage of the tooth.

According to possible embodiment, the electronic module 4 may be configured so as to perform one or more of the following functions: managing the OBD communication vehicle information/data and from an on-board electronic control unit through the pins 3, and/or permanently/temporarily storing vehicle information/data, and/or transmitting vehicle information/data to a remote system through wireless communication system such as, for example, 2G, 3G, Wi-Fi, Bluetooth, or the like, and/or managing the communication of information/data to other electronic devices/modules/equipment through the side pins 25.

It is clear that the electronic module 4 may have one or more additional printed circuit boards (not shown) which are arranged in the casing 5 in adjacent positions and facing each other to lie in planes substantially orthogonal to the axis A, and have a structure entirely similar to that of the aforesaid board 15 to be coupled, at the respective perimeter edges 19, to one or more of the second segments 12, 29 of the pins 3 and/or 25.

The present invention also concerns the method for implementing the aforesaid diagnostic module 1, comprising the steps of: arranging an OBD connector 2 of the aforesaid type, whose pins 3 are Z-shaped so that the first segments 11 project from the face 7 of the socket 6 to form two rows along the two opposite longer sides 13 of said socket; arranging the printed circuit board 15, made as previously described, so that the notches 20 formed on the two opposite longer sides 21 of the board 15 house the first segments 11; inserting the first segments 11 of the pins in the notches 20 of the board 15 so that the board 15 has its face 16 preferably resting on spacer elements 24 of the socket 6, soldering the first segments 11 on the printed circuit board 15 in correspondence to said notches through a reflow soldering, inserting the socket 6 in the mouth of the casing 5 in order to lock the board 15 inside the casing 15.

It is clear that, according to a different embodiment (not shown), the connector 2 may have a structure different from the one set by the aforesaid OBD standard, and may have a plurality of pins 3 shaped and coupled to the printed circuit board 15 as previously described. In particular, the number and the arrangement of the pins 3 inside the collar 9 according to this embodiment are different from the number (16 pins) and arrangement (parallel double row) set by the OBD standard. However, analogously to what previously described, the first segments 11 of the rigid pins 3 in the connector 2 (which does not meet the OBD standard) are made according to the aforesaid inventive principle, namely they project from the inner face 7 of the socket 6 to be parallel to the longitudinal axis A orthogonal to the printed circuit board 15, and each of them is inserted in a notch 20 formed on a side of the outer perimeter edge 19 of the printed circuit board 15, where the first segment 11 is electrically coupled to the printed circuit board 15.

The combination of technical characteristics relating to the shape of the rigid Z-shaped pins and the insertion of the end of the pins in the notches formed on the lateral perimeter edge of the printed circuit board to achieve the electrical coupling between the boards and the pins allows to decrease the overall size of the diagnostic module and, therefore, to overcome the aforesaid technical problems associated with the risk of breakage/failure of the module due to shock and vibration.

It is also possible to implement the board/pins coupling by means of industrial recast processes, thus obtaining on the one hand a reduction of costs and on the other hand an increase in productivity.

Furthermore, the module allows on the one hand to exchange data through additional protocols, namely not included in the OBD standard, without altering the geometry of the head/casing and the number/arrangement of the electrical couplings and/or related couplings, and on the other hand guarantees an effective mechanical coupling between the OBD male/female connectors.

Finally, it is clear that the aforesaid OBD diagnostic interface module can be modified and varied without departing from the scope of the present invention defined by the appended claims.

The invention claimed is:
1. A vehicle diagnostic interface module (1) comprising:
   a protective outer casing (5),
   an electronic module (4) which is provided with at least one printed circuit board (15) arranged inside said protective outer casing (5), and
   a connector (2) provided with a plate-like contact-carrier socket (6), which is coupled to said outer casing (5) and is arranged parallel to said printed circuit board (15) orthogonal to a longitudinal reference axis (A), and comprises an inner face (7) facing to said printed circuit board (15); said connector (2) further comprising a collar (9) projecting from an opposite outer face (8) of said socket (6); said printed circuit board (15) having a first larger face (16) adjacent to said inner face (7) of the socket (6);
   said vehicle diagnostic interface module (1) being characterized in that it comprises a plurality of rigid pins (3) which are integrated into said socket (6); each rigid pin (3) is shaped so as to comprise:
   a first segment (11) which projects from said inner face (7) of the socket (6) in order to be parallel to said longitudinal axis (A) orthogonal to said printed circuit board (15);
   a second segment (10) that projects from said outer face (8) of said socket (6) opposite said inner face (7) so as to protrude/extend within said collar (9) while remaining parallel to said longitudinal axis (A); and
   a central intermediate segment (12) which is integrated into said socket (6) and extends within said socket (6) along a direction transverse to said longitudinal axis (A);
   wherein said pins (3) are integrated into said socket (6) so as to form two parallel rows of second segments (10) facing each other on said outer face (8) and two parallel rows of first segments (10) facing each other on said inner face (7) of said socket (6);
   said socket (6) and said printed circuit board (15) are substantially rectangular;
   said two rows of first segments (11) are arranged on the respective opposite larger sides (21) of said printed circuit board (15), these larger sides being, in turn, arranged parallel and adjacent to the opposite larger sides of said socket (6);
   said first segments (11) being inserted in notches (20) formed on said opposite larger sides (21) of said printed circuit board (15), where they are electrically coupled to said printed circuit board (15).

2. The module according to claim 1, wherein the distance (D1) between the two rows of second segments (10) being less than the distance (D2) between the two rows of first segments (11).

3. The module according to claim 1, wherein the distance (D2) between the two rows of first segments (11) approximates by defect to the distance (D3) between the opposite larger sides of said socket (6).

4. The module according to claim 1, wherein said collar (9) is a trapezoidal collar (9) that projects from said outer face (8) of the socket (6) opposite said inner face (7) along said axis (A); said module further comprises side pins (25), which have a first segment (29) inserted in a notch (30) formed on a smaller side (40) of said printed circuit board (15), and a second segment (27) inserted in a longitudinal notch (28) which is formed on said collar (9) and extends parallel to said axis (A).

5. The module according to claim 4, wherein said side pins (25) comprise a first segment (29) which projects from said inner face (7) so as to protrude/extend within said casing (5) while remaining parallel to the axis (A) so as to be housed in said notch (30); a second segment (27) which projects from said outer face (8) so as to protrude/extend within a respective notch (28) formed on a side wall of the collar (9) while remaining parallel to the longitudinal axis (A); and a central intermediate segment (31) which is integrated into the socket (6) and extends within the same along a direction transverse to said longitudinal axis (A).

6. The module according to claim 5, wherein said notches (28) extend parallel to each other and to the longitudinal axis (A) for substantially the height of the collar (9) measured along the axis (A).

7. The module according to claim 5, wherein said second segments (27) of said side pins (25) are shaped so that, in use, they are electrically coupled to corresponding additional electrical side contacts present on one or more side surfaces of an OBD female electrical connector coupled to it.

8. The module according to claim 5, wherein said side pins (25) comprise two side pins (25) having said second segments (27) arranged on two respective longitudinal notches (28) formed on a first oblique side of said collar (9) and four side pins (25) having said second segments (27) arranged in four longitudinal notches (28) formed on a second oblique side of said collar (9) opposite to said first side.

9. The module according to claim 5, configured to communicate by means of said side pins (25) information/data through a communication protocol not included in the OBD standard.

10. The module according to claim 5, configured to communicate, through said side pins (25), information/data through a protocol chosen among: USB, Ethernet, LAN.

11. The module according to claim 1, wherein said first segment (11) is electrically coupled to said board (15) in correspondence to said notch (20) by means of reflow soldering.

12. The module according to claim 1, wherein said inner face (7) of said socket (6) has at least one seat/recess (23) designed to house the electronic components (22) projecting from said first face (16) of said printed circuit board (15) and a plurality of spacer elements (24) against which the first face (16) of said printed circuit board (15) rests.

13. The module according to claim 1, wherein said pins (3) are substantially Z-shaped.

14. The module according to claim 1, wherein said collar (9) is trapezoidal and the smaller base of said trapezoidal collar (9) is shaped so as to form two flexible tongues (32), coplanar and parallel to each other and to the smaller base, which are arranged on opposite sides of the central plane of said collar (9) and are structured to form, in use, a snap-lock fastening system with an engagement tooth arranged on said diagnostic socket or an OBD electrical connector coupled thereto.

15. The module according to claim 1, wherein said connector (2) is a connector made according to the OBD standard, said second segments of the pins (3) are arranged according to the OBD standard and said electronic module (4) is configured to communicate through said pins (3) according to the OBD standard.

16. The module according to claim 1, wherein a row of first segments (11) lies in a plane parallel to but not coincident with the lying planes of the rows of second segments (10).

17. The module according to claim 1, wherein said casing (5) comprises a cover having a thickness measured along said axis (A) smaller than about 1 cm.

18. The module according to claim 1, wherein said inner face (7) of the socket (6) has projecting spacer elements (24) on which said printed circuit board (15) rests.

19. The module according to claim 1, wherein the printed circuit board (15) has electronic components (22) on both opposite larger faces.

20. The method for producing a vehicle diagnostic interface module (1) structured to be coupled to a diagnostic port of a vehicle made according to claim 1, wherein said socket (6) and said printed circuit board (15) are rectangular;

the method comprising the steps of:
arranging said connector (2), which has first segments (11) projecting from the inner face (7) of the socket (6) so as to form at least one row along an outer side (13) of said socket;
arranging said printed circuit board (15) having notches (20) formed on the opposite larger sides (21) of the outer perimeter edge of the board (15) to house the first segments (11);
inserting said first segments (11) of the pins (3) in the notches (20) formed on the opposite larger sides of the board (15) so that the board (15) has its face (16) resting against the face (7) of the socket (6); and
soldering on the first segments (11) to the printed circuit board (15) in correspondence to said notches (20) through a reflow soldering.

* * * * *